United States Patent
Raghavan et al.

(10) Patent No.: US 9,460,261 B2
(45) Date of Patent: Oct. 4, 2016

(54) COMPUTER-IMPLEMENTED VERIFICATION SYSTEM FOR PERFORMING A FUNCTIONAL VERIFICATION OF AN INTEGRATED CIRCUIT

(71) Applicant: Vayavya Labs Private. Limited, Belgaum (IN)

(72) Inventors: Srivatsan Raghavan, Bengaluru (IN); Karthick Gururaj, Bengaluru (IN); Sandeep Pendharkar, Bengaluru (IN); Someshwar DK, Bengaluru (IN); Shrinivas Nagaraddi, Bengaluru (IN)

( * ) Notice: Subject to any disclaimer, the term of this patent is extended or adjusted under 35 U.S.C. 154(b) by 0 days.

(21) Appl. No.: 14/638,475

(22) Filed: Mar. 4, 2015

(65) Prior Publication Data
US 2015/0310159 A1    Oct. 29, 2015

(30) Foreign Application Priority Data
Mar. 5, 2014    (IN) .......................... 1130/CHE/2014

(51) Int. Cl.
*G06F 17/50*    (2006.01)
(52) U.S. Cl.
CPC ................. *G06F 17/5081* (2013.01)
(58) Field of Classification Search
CPC ...................................... G06F 17/50
USPC ....................................... 716/111
See application file for complete search history.

(56) References Cited

U.S. PATENT DOCUMENTS

| | | |
|---|---|---|
| 8,560,985 B1 | 10/2013 | Sahu et al. |
| 8,893,065 B2 | 11/2014 | Agarwala et al. |
| 2013/0007549 A1 | 1/2013 | Chan |
| 2013/0185056 A1* | 7/2013 | Ingram ............... G06F 11/3684 704/9 |
| 2013/0318486 A1 | 11/2013 | Sasaki |

* cited by examiner

*Primary Examiner* — Thuan Do
(74) *Attorney, Agent, or Firm* — The Law Office of Austin Bonderer, PC; Austin Bonderer

(57) ABSTRACT

A computer-implemented verification system for performing a system level or a system on chip level functional verification of integrated circuit is provided. The computer-implemented system includes one or more processors and a memory storing instructions defined by one or more modules of including a scenario compiler, a verification component and a software library component. The scenario compiler receives a set of verification scenario intents including at least one of test-application intents, constraints, device-programming intents and scenario-control intents. The scenario compiler generates one or more open verification methodology (OVM) and/or universal verification methodology (UVM) compliant test bench sequences and one or more scenario software implementations based on the set of verification scenario intents. The verification component interacts with the integrated circuit using the OVM and/or UVM compliant test bench sequences. The software library component enables execution of the scenario software implementations on a processing unit core of the integrated circuit.

11 Claims, 6 Drawing Sheets

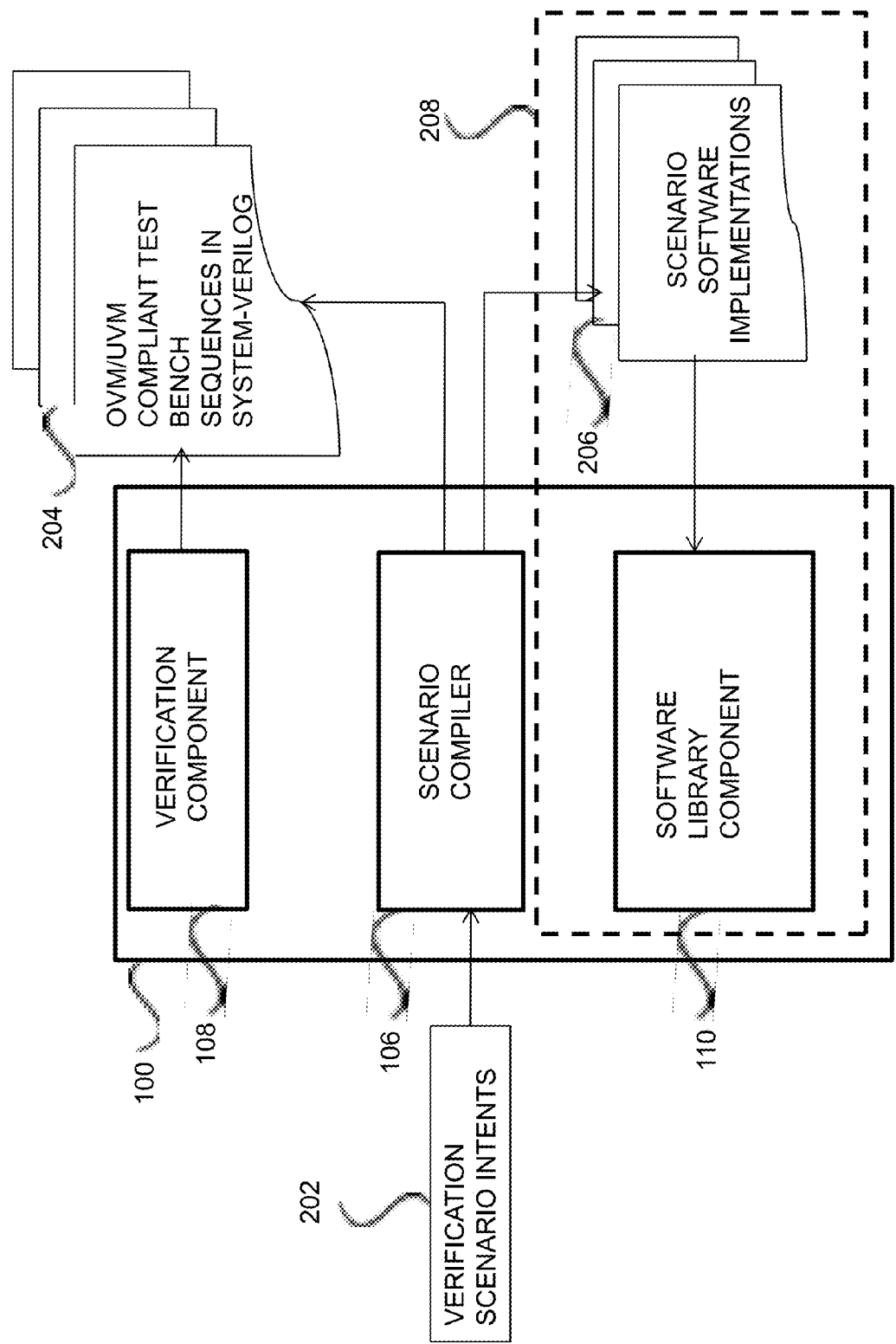

COMPUTER-IMPLEMENTED VERIFICATION SYSTEM FOR PERFORMING A FUNCTIONAL VERIFICATION OF AN INTEGRATED CIRCUIT

CROSS REFERENCE TO RELATED APPLICATIONS

This application claims priority to and the benefit of the provisional patent application number 1130/CHE/2014 titled "An Automatic Test Software Generation Tool From Scenario Specification For Verifying System-On-Chip On Simulation And Emulation Platforms" filed in the Indian Patent Office on Mar. 5, 2014. The specification of the above referenced patent application is incorporated herein by reference in its entirety.

BACKGROUND

The embodiments herein generally relate to verification of integrated chips, and more particularly to a computer-implemented verification system for performing a system level verification or a system on chip level verification of integrated circuits.

Typically, a hardware system comprises of multiple functional units connected to one another via a common interconnect (termed as bus-fabric). The functional units may be designed so as to achieve a variety of functionalities/objectives. Many of the functional units may have multiple configuration settings resulting in varied functionality of the hardware system as a whole. Pursuant to an exemplary scenario, the hardware system as a whole may need to be verified for functionality and performance goals, through a process termed as functional verification. Functional verification is an important process in development of an Integrated Circuit (IC) & involves almost 50-70% of project time and is widely acknowledged to be a bottleneck in the development time with major investment in time and resources. The motivation for the functional verification process is to constantly track the design changes/modifications against the original specifications and usually requires an executable model of the design that eventually translates into an IC product.

The functional verification process tries to find deviations in design implementation (design flaws) that are contrary to a specification. The functional verification process involves executing a large number of tests usually generated by random test generators on the executable model & comparing them against expected outputs in conformance with specifications. Currently, in system-On-Chip (SOC) methodology, majority of designs have at least one embedded central processing unit (CPU) core to execute software so as to enable, disable or change the functionality of underneath hardware as demanded by applications reacting to system conditions or user inputs.

The SOC methodology hinges on vendors integrating pre-verified functional units or design Intellectual Properties (IPs) from trusted IP-vendors based on standard bus protocols to create a functional system and defers detection of system-level issues to integration time at the cost of SOC vendor's time-to-market (TTM). With ever-crunching TTM it becomes imperative for SOC vendors to detect system-level issues early in verification flow. The current trend of placing much of hardware features under the control of the software makes the SOC verification process to view a system-under-test as a combination of software and hardware. This makes the process of verification complex and extended as it imposes software to be included and available during the process.

At system-level much of the verification emphasis is on interaction between functional units (or design-IPs) over common bus interconnects. System-level bugs arise from the interaction themselves and not in the design-IP functionality itself. Since the system as a whole is intended to support heterogeneous interactions among design-IPs concurrently, it places system-level resources and logic under strain. Much of system-level issues can be attributed to concurrency in interactions and can be dormant if not stimulated well. Hence much of the system-level verification effort focuses on placing the system-under test around a test bench and carefully orchestrating concurrency in interactions in the system. Effective system-level verification involves placing the SOC in a verification environment which provides the means to observe, and verify interaction issues.

Current verification techniques involve conversion of a system-level scenario of interest into directed test-software and test-bench components through manual development. Directed test-software executing on the embedded core in conjunction with constrained random techniques used on test bench components are prevalent today. Manual development of directed software and relevant test-bench components for individual scenarios is not a scalable approach. As mentioned earlier, to detect hard-to-find bugs it is important to increase concurrency in interactions. This implies combining multiple scenarios which can be played out concurrently on the system-under-test. This approach makes it difficult for verification process to scale on increasing interaction. Accordingly, there remains a need for system for test software generation based on system-level scenario in specification form for functional verification of system-on-chip on simulation and emulation platforms.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

A number of computer-implemented verification systems for performing for performing a system level or a system on chip level functional verification of an integrated circuit are disclosed. The computer-implemented verification systems disclosed herein address the above stated need for test software generation based on system-level scenario in specification. In an embodiment, the computer-implemented verification system includes one or more processors and a memory storing instructions defined by one or more modules of the computer-implemented verification system. The processors are configured to execute the instructions. The modules include a scenario compiler, a verification component and a software library component. In an embodiment, the scenario compiler is configured to receive a set of verification scenario intents from a user. The set of verification scenario intents includes at least one of a) one or more test-application intents, b) one or more constraints, c) one or more device-programming intents and d) one or more scenario-control intents. The scenario compiler is configured to generate one or more open verification methodology (OVM) and/or universal verification methodology (UVM) compliant test bench sequences and one or more scenario software implementations based on the set of verification scenario intents. In an embodiment, the verification component is configured to interact with the integrated circuit using the generated one or more OVM and/or UVM compliant test bench sequences. The software library component enables execution of the scenario software implementations on at least one processing unit core of the integrated circuit.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

FIG. 2B depicts exemplarily illustrates an input/output flow diagram with an exploded view of the computer-implemented verification system of FIG. 1, according to an embodiment;

DETAILED DESCRIPTION OF THE INVENTION

Figure 1:
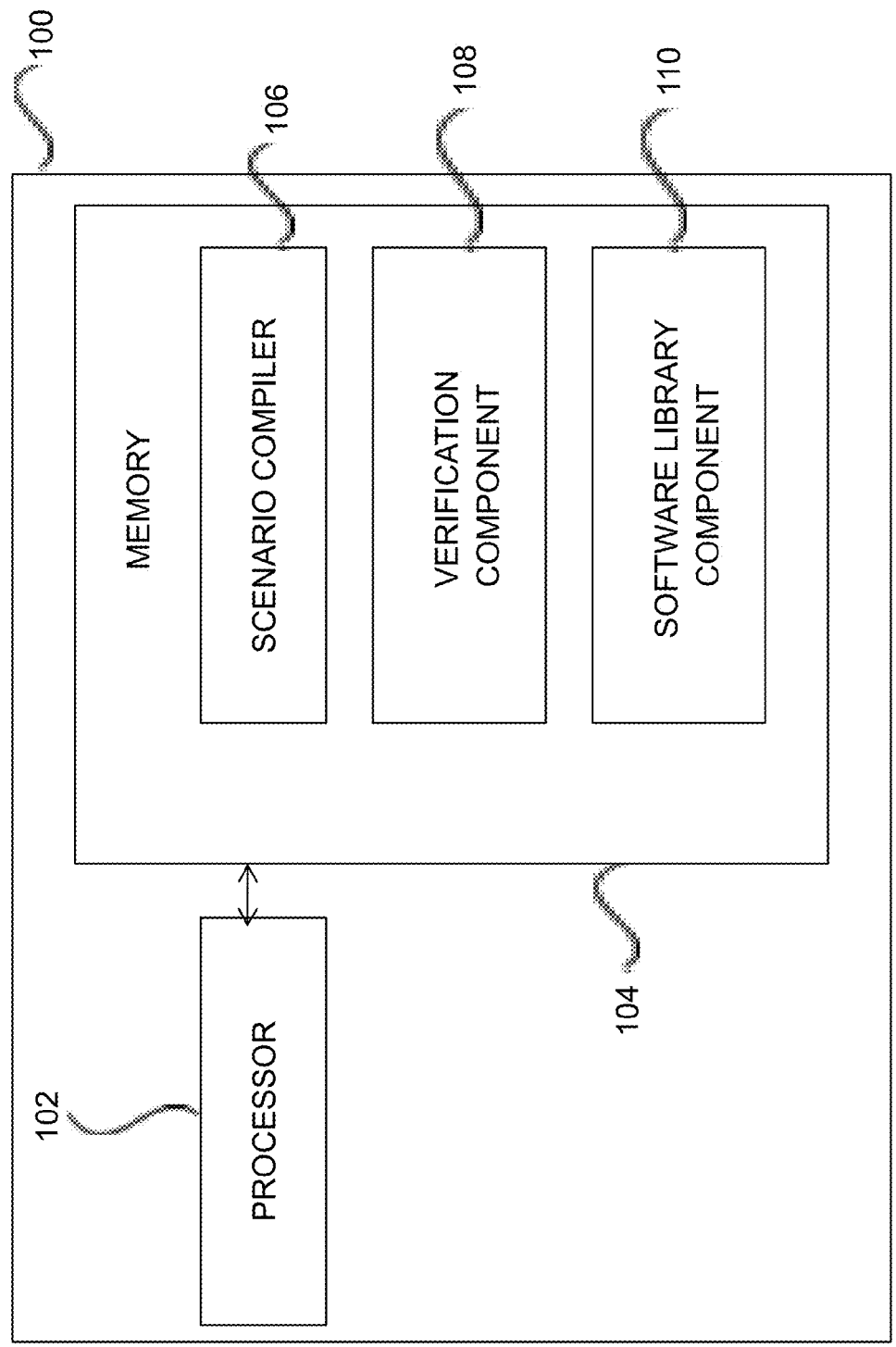
FIG. 1 exemplarily illustrates a block diagram of a computer-implemented verification system for performing a functional verification of an integrated circuit, in accordance with an embodiment.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Pursuant to an exemplary scenario, existing functional verification techniques for system on chip (SOC) lack in quality of system-level issues that may be detected within a given time. For effective system-level verification of SOC it is necessary to rely on test-software that are reflective of real-world application and that in coordination with a test bench will find system-level issues that might otherwise go undetected. The choice of test-software executing on the embedded core(s), in conjunction with test-bench components, should enable and portray system-level issues or scenarios of choice. The choice of what to execute on the embedded core(s) of a SOC is dependent upon various parameters of the verification environment and the stage in the verification cycle. Verification environments range from high-throughput virtual-prototype platforms and emulation platforms to high observability and controllability RTL simulation platforms. A failure on one platform should be reproducible on the platform of choice for further debug. Such varied platforms and their test-benches place further requirements/constraints on test-software development and verification of system-level issues.

The choice of production software at early stages of verification, when RTL is yet to be signed-off, is ruled out as they are monolithic and unwieldy to debug on simulation platforms. The early stages of system-level verification require lean software that highlight basic issues rapidly and reduce debug time. A legacy test-software may be used if SOC is a variant within a family. However, porting/re-use of legacy software across SOC product families comes at the cost of maintenance overhead and documentary support. With such varied requirements and multitude of platforms, developing test-software for verification purposes becomes a challenge. An average SOC today is an integration of several design IPs working and interacting in a multitude of ways with other IPs. Developing directed test-software from scratch to test individual system-level issues/scenarios is not a scalable approach within a given Time-To-Market (TTM) and verification budget. In addition, the cost of keeping the test-software and test bench coordination details in software form is not scalable either. With both test-software and test bench changing over time the software representation become obsolete even though the system-level issue/scenario may be relevant for future.

The prudent method of capturing system-level scenario is in its specification form. The specification form should capture the context of system-level issue under study, the functional components, test bench components if any and their respective properties/settings. In addition, the choice of specification language should be verification friendly and palatable to the verification community.

Various embodiments of the present technology provides a computer-implemented verification system for automatic generation of test software and test bench components based on verification scenario intents comprising at least one of a test-application intent, at least one constraints, a device-programming intent and a scenario-control intent specified in a subset of SystemVerilog constructs for functional verification of system-on-chip on simulation and emulation platforms that overcomes the drawbacks of the above described and other existing technologies for functional verification of an integrated circuit. Referring now to the drawings, and more particularly to FIGS. 1 through 5, where similar reference characters denote corresponding features consistently throughout the figures, there are shown preferred embodiments.

FIG. 1 exemplarily illustrates a block diagram of a computer-implemented verification system 100 for performing a system level or a system on chip level functional verification of an integrated circuit, in accordance with an embodiment. In an embodiment, the computer-implemented verification system 100 includes, one or more processors such as processor 102 and a memory 104 storing instructions defined by one or more modules of the computer-implemented verification system 100 to configure the one or more processors (such as processor 102) to execute instructions. In an embodiment, the modules include a scenario compiler 106, a verification component 108, a software library component 110.

In an embodiment, the scenario compiler 106 is configured to receive a set of verification scenario intents from a user. The set of verification scenario intents comprises at least one of one or more test-application intents, one or more constraints, one or more device-programming intents and one or more scenario-control intent. The term "test-application intent" refers to the core verification intent of what is to be tested, provided in a specification language. The specification language includes for example SystemVerilog. The term "constraints" refers to one or more constraints on a verification scenario/intent, provided in the specification language. The term "device-programming intent" refers to a mechanism to program underneath hardware registers, provided in the specification language. The term "scenario-control intent" refers to how and when a scenario needs to be executed in conjunction with other scenarios or testbench events. The scenario compiler 106 generates one or more open verification methodology (OVM) and/or universal verification methodology (UVM) compliant test bench sequences and one or more scenario software implementations based on the set of verification scenario intents.

In an embodiment, the device-programming intent may be generated from a abstract description of how the device programming needs to be done. In an embodiment, test-application intent may be hierarchically constructed from one or more test-application intents. In an embodiment, the scenario-control may be hierarchically constructed from one or more scenario-control intents. In an embodiment, the device-programming intent can be hierarchically constructed from one or more device-programming intents. In an embodiment, a constraint can be hierarchically constructed from one or more constraints. The term "constructed from" in the paragraph above may be performed using SystemVerilog language features of class composition and/or class inheritance. Such a construct is referred to as "hierarchical combination".

An illustrative example for how test-application intent can be hierarchically constructed using other test-application intents using class composition is shown below. The "multi_scn_seq" is a test-application intent, which is a hierarchical combination of two other test-application intents as follows:

```
" "eth_tx_seq" and "uart_rx_seq"class multi_scn_seq extends
socx_sequence;
    eth_tx_seq eth_tx_seq_h;
    uart_rx_seq uart_rx_seq_h;
    function new( );
        eth_tx_seq_h = new( );
        uart_rx_seq_h = new( );
    endfunction
    task body( );
    fork
        eth_tx_seq_h.start(m_sequencer);
        uart_rx_seq_h.start(m_sequencer);
    join
    endtask
endclass "
```

The set of verification scenario intents are specified in a subset of a set of SystemVerilog constructs. In an embodiment, the one or more test-bench sequences are generated in SystemVerilog. In an embodiment, the set of verification scenario intents is provided using extensions to at least one of a set of base classes comprising a resource base class, a scenario base class, a scenario extended class, and a sequence-item base class. In an embodiment, the resource base class may be intended to a programming intent associated with a resource, the resource representing a leaf level abstraction that captures one or more device programming details. The scenario base class may be intended to capture the test-application intent and associated with one or more predefined virtual tasks and functions. The scenario extended class may be associated with a constraint intent class. The sequence-item base class represents the constraint intent that is imposed on the test-application intent during execution. In an embodiment, the software library component 110 enables execution of the scenario software implementations on at least one processing unit core of the integrated circuit.

In an embodiment, the generated scenario software implementation includes a multi-threaded 'C' or 'C++ software. In another embodiment, generated the scenario software implementation is a single threaded 'C' or 'C++' software. In an embodiment, the software library component 110 executes on at least one processing unit core of the integrated circuit and for providing thread support and handling coordination with the scenario compiler 106.

In an embodiment, the computer-implemented verification system 100 is configured to operate with a verification platform configured to verify the integrated circuit. The verification platform may include any existing verification platform that is either a simulated version or an emulated version. The one or more scenario software implementations are executable on the verification platform of the integrated circuit. The verification platform may be configured to operate with the verification component 108 along with the generated OVM and/or UVM compliant test bench sequences. In an embodiment, the software scenario implementations is linked with the software library component 110 to form a software executable. In an embodiment, the software executable is loaded into a system-memory of the integrated circuit. In an embodiment, upon or subsequent to execution of the software executable on the system memory, the software executable is fed with a plurality of values for each run of the test-application intent for verifying a plurality of use-cases associated with the test-application intent.

In an embodiment, the OVM and/or UVM compliant test bench sequences along with the verification component 108, a test-bench and the integrated circuit are compiled to form a simulation executable upon the verification platform being simulated. The simulation executable executes on a host computer for the functional verification of the integrated circuit. In an embodiment, the integrated circuit is compiled to form an emulation image upon the verification platform being emulated. The emulation image executes on the verification platform. The verification platform is configured to connect a host computer that executes a simulation executable comprising at least one of OVM and/or UVM compliant test bench sequences, the verification component 108, and the test-bench (not shown) for the functional verification of the integrated circuit. In an embodiment, the verification component 108 coordinates one or more activities of the one or more scenario software implementations, the software library component 110 and the test bench on the verification platform of the integrated circuit during the functional verification.

In an embodiment, the simulation executable and the software executable may be loaded into a system memory associated with the integrated circuit and are executed for the functional verification of the integrated circuit. In an embodiment, at least one of the test-application intent, at least one constraint, the device-programming intent, and/or the scenario-control intent are decoupled from one another. In an embodiment, the scenario compiler 106 is configured to automatically infer from a hierarchical combination of at least one of the test-application intent, at least one constraint, the device-programming intent, and/or the scenario-control intent that are decoupled from one another. The scenario compiler 106 generates one or more OVM or UVM compliant test bench sequences, and one or more scenario software implementations based on the inferred hierarchical combination.

In an embodiment, scenario compiler 106 is configured to receive one or more test application intents in an encapsulated form for generating one or more OVM or UVM compliant test bench sequences and one or more scenario software implementations based on the encapsulated form of the one or more test application intents. In an embodiment, a test application intent is linked with one or more constraint-intents for enabling verification of multiple use-cases of the test-application intent with a plurality of constraint values conforming to the associated constraint intents. In an embodiment, the scenario compiler 106 is configured to automatically generate a plurality of infrastructure components within the scenario software implementations to route the plurality of constraint values from the verification component 108 to one or more test-applications executing on the integrated circuit.

Although the present embodiments have been described with reference to specific example embodiments, it will be evident that various modifications and changes may be made to these embodiments without departing from the broader spirit and scope of the various embodiments, for example, the various modules, such as the scenario compiler 106, the verification component 108, and the software library component 110 described herein may be enabled and operated using a firmware, software and/or hardware circuitry or any combination of hardware, firmware, and/or software (e.g., embodied in a machine readable medium). Also various devices and methods disclosed herein may be embodied using transistors, logic gates, and electrical circuits (e.g., Application Specific Integrated (ASIC) Circuitry and/or in Digital Signal Processor (DSP) circuitry).

The embodiments herein can take the form of, an entirely hardware embodiment, an entirely software embodiment or an embodiment including both hardware and software elements. The embodiments that are implemented in software include but are not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor (such as processor 102) coupled directly or indirectly to memory elements through a system bus. The memory elements (such as memory 104) may include local memory employed during actual execution of the program code, bulk storage, and cache memories which provide temporary storage of at least some program code in order to reduce the number of times code must be retrieved from bulk storage during execution. Input/output (I/O) devices (including but not limited to keyboards, displays, pointing devices, remote controls, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 2A:
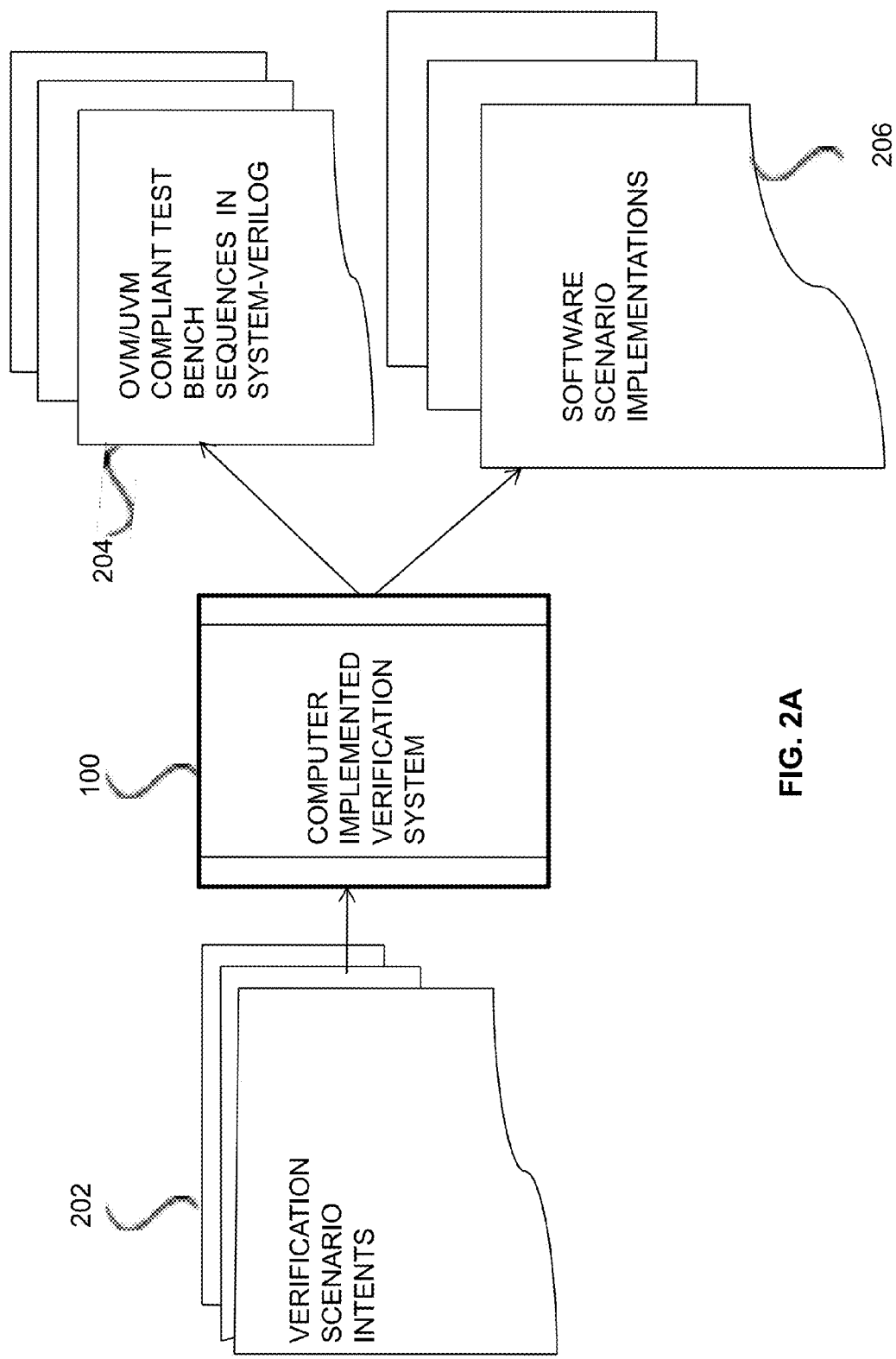
FIG. 2A exemplarily illustrates an input/output flow diagram of the computer-implemented verification system of FIG. 1, in accordance with an embodiment.

FIG. 2A exemplarily illustrates an input/output flow diagram of the computer-implemented verification system 100 of FIG. 1, according to an embodiment. As depicted in FIG. 2A, the computer-implemented verification system 100 accepts a set of verification scenario intents 202 (for example including one or more scenario specifications) as an input and generates one or more OVM and/or UVM compliant test bench sequences in System-Verilog and one or more scenario software implementations 206 that may be single or multi-threaded and may be for example, ANSI-C compliant.

An example of a test-application header and functions for the generated the scenario software implementation 206 for a given scenario specification is as below:

```
" /*!@file socx_scenario.h
* @brief Contains all scenario related macros and object structure
*/
#ifndef _SOC_SCENARIO_H_
#define_ SOC_SCENARIO_H_
#include "socx_generated_file.h"
#include "socx_resources.h"
#define TOTAL_SCENARIO_COUNT 1
#define SOCX_ETH_RX_SCN_SCENARIO 2
#define ETH_RXBUFF_SIZE 512
struct eth_rx_scn {
    struct eth_mac* mac;
    char rx_buffer[ETH_RXBUFF_SIZE];
    eth_pkt_item_s* seq_item;
    void* seq_item_channel;
    socx_bool (*pre_init) (struct eth_rx_scn*);
    void (*init) (struct eth_rx_scn*);
    void (*run) (struct eth_rx_scn*);
    void (*finit) (struct eth_rx_scn*);
    void (*post_finit) (struct eth_rx_scn*);
    void (*run_scenario) (void*);
    void (*end_of_scenario) (void*);
};
void app_init( );
void scenario_socx_mem_init( );
void eth_rx_scn_new( );
socx_bool eth_rx_scn_pre_init(struct eth_rx_scn* obj);
void eth_rx_scn_init(struct eth_rx_scn* obj);"
```

The verification scenario intents 202 may be specified in a sub-set of SystemVerilog constructs and is to be compliant with a test-development methodology supported by the computer-implemented verification system 100. The computer-implemented verification system 100 enforces the methodology through a set of four base classes and expects users to specify their intent through extensions of these classes. The intention of enforcing a methodology is to maximize re-use and enable ease in combining scenarios. In one embodiment, computer-implemented verification system 100 enables provision of a core verification intent, of what is to be tested, provided in an existing specification language associated with the system-under test/integrated circuit. It is noted that the term "system-under test" is used interchangeably with the term "integrated circuit" throughout the specification.

A scenario at its atomic level captures an interaction between two units, with data being read from one unit and written into other unit. The unit being read for data is termed as a source while the one written with data is termed as sink. The OVM and/or UVM compliant test bench sequences 204 and the scenario software implementations 206 that are generated may plug/work with the verification component 108. In an embodiment, the generated OVM and/or UVM compliant test bench sequences 204 encapsulate all the necessary control logic to coordinate an event activity of the test bench with activity of the scenario software implementations 206. The control and coordination is handled by the verification component 108 on a test-bench side and the software library component 110 on the test-software side.

In addition, the computer-implemented verification system 100 generates one or more top-level OVM or UVM compliant test bench sequences to execute the generated OVM or UVM compliant test bench sequences 204. An example of the generated OVM or UVM compliant test sequence is as below:

```
"include "socx_gen_seq_item.svh"
class socx_eth_tx_seq      extends ovm_sequence #(eth_pkt_item);
        'ovm_object_utils(socx_eth_tx_seq)
                eth_pkt_item     m_eth_pkt_item;
        socx_event_manager m_event_mgr;
        function new(string name = "socx_eth_tx_seq");
                super.new(name);
        endfuntion
        function void assign_event_mgr(socx_event_manager
        x_event_mgr);
                m_event_mgr = x_event_mgr;
        endfunction
        task body( );
                m_event_mgr.wait_on_event("eth_rx_scn",
```

-continued

```
'SOCX_SCN_CHNL_CREATED_EVENT);
        repeat (3) begin
                'ovm_do(m_eth_pkt_item)
        end
        m_event_mgr.send_command("eth_rx_scn",
'SOCX_RUN_SCENARIO);
        m_event_mgr.wait_on_event("eth_rx_scn",
        'SOCX_SCN_END_OF_SCN_EVENT);
        endtask
Endclass "
```

When a top-level OVM and/or UVM test starts an execution of the verification scenario intent of a user on a verification platform of the integrated circuit, during simulation and/or execution, based on one or more constraint intents of the user, the scenario software implementations executing on a processing unit (for example CPU) of the integrated circuit (system-under-test) is fed with different values for each run of a test-application intent to ensure that multiple use-cases for the same test-application intent are verified to achieve a higher coverage. The computer-implemented verification system 100 achieves the above by keeping a memory manager component present with the verification component 108 and the software library component 110 running on the system-under-test in synchronization. One or more constraint intents of the user are solved by a simulation engine that simulates the system-under-test. To enable tighter event coordination between the test-bench and the software (scenario software implementations) running on the system-under-test, the computer-implemented verification system 100 provides mechanisms to trigger a test-bench activity from the software and vice-versa. The computer-implemented verification system 100 achieves the above by keeping an event/memory manager component present with the verification component 108 and the software library component 110 running on the system-under-test in synchronization.

An example of the event manager component is as below:

```
"class socx_event_manager extends ovm_component;
        socx_agent m_agent;
        socx_event socx_sw_init_done_event;
        socx_event scox_launch_seq_event;
        socx_launch_seq_helper m_launch_seq_helper;
        scox_launch_seq_struct_mbox_t     m_socx_launch_seq_struct_mbox;
        socx_command_out_obj_mbox_t       m_socx_command_out_mbox;
        /* static hash tables */
        int m_scn_to_seq_item_size [string];
        int m_scn_to_seq_item_type [string];
        int m_scn_to_scn_id[string];
        string m_scn_to_seq_item str[string];
        /* dynamic hash table */
        socx_scenario m_scn_id_to_scn_handle[int];
        int m_uniq_id;
        'ovm_component_utils_begin(socx_event_manager)
                'ovm_field_object(socx_sw_init_done_event, OVM_ALL_ON)
                'ovm_field_object(socx_launch_seq_event, OVM_ALL_ON)
        'ovm_component_utils_end
        function new(string name = "socx_event_manager", ovm_component
        parent);
                super.new(name, parent);
                m_uniq_id = 0;
                m_scn_to_seq_item_size["eth_rx_scn"]               =
```

```
'SOCX_ETH_PKT_ITEM_SIZE;
    m_scn_to_seq_item_type["eth_rx_scn"]           =
'SOCX_ETH_PKT_ITEM_TYPE;
    m_scn_to_seq_id["eth_rx_scn"] = 'SOCX_ETH_SCN_SCENARIO;
    m_scn_to_seq_item_str["eth_rx_scn"]            =
'SOCX_ETH_PKT_ITEM_TYPE_STR;
    socx_sw_init_done_event      =      scox_event:      :type_id:
:create("socx_sw_init_done_event");
    socx_launch_seq_event        =      scox_event:      :type_id:
:create("socx_launch_seq_event");
    m_launch_seq_helper=socx_launch_seq_helper::type_id:
:create("m_launch_seq_helper",
            this);
        endfunction"
```

In an embodiment, one or more synchronization details are streamed between the scenario compiler 106, the verification component 108 and the software library component 110 through one or more memory channels created in a memory 350 of the system-under-test 320. The above described infrastructure of a memory channel, the verification component 108 and the software library component 110 components makes it possible for one or more users to coordinate event activity in the test-bench and the scenario software implementations. In one embodiment, the computer-implemented verification system 100 of the present technology has a) an ability to raise or drop OVM or UVM objection while in execution, b) an ability to launch OVM or UVM sequence on any verification IP component present in the test-bench from the software, c) the capability of providing tool-defined synchronization events and call backs on these events in a test-bench side, d) provision for defining user-defined events and call backs on such events, and e) provision for defining the software coverage points and sampling them.

In an embodiment, the scenario software implementation executing on the integrated chip can prevent a UVM and/or OVM test from prematurely stopping the execution by raising and dropping one or more UVM and/or OVM objections at appropriate points in execution.

To enhance visibility and debug-ability in execution of scenario software implementation on the integrated chip, the execution is divided into one or more well-defined phases. At the end of each phase, the verification component 108 is informed about completion of the phase. The verification component 108 is enabled to provide prints to show a progress of execution of one or more scenario software implementations. In one embodiment, the phases defined are: NEW (memory allocated), PRE-INIT (pre-initialize), NIT (initialize), RUN (execute sequence), FINIT (execution complete), POST-FINIT and DELETE (memory de-allocated).

The execution of scenario software implementation on the integrated chip should be in synchronization with the execution of the OVM and/or UVM compliant test bench sequences. In one embodiment, this synchronization is achieved by providing controls to the scenario software implementation to launch the OVM and/or UVM compliant test bench sequences at appropriate points in execution. In one embodiment, this synchronization is achieved by providing user-defined events that may be notified by scenario software implementations and may trigger OVM and/or UVM compliant test bench sequences upon notification.

In an embodiment, upon or subsequent to execution of the software executable on the system memory of the system-under-test, the software executable is fed with a plurality of values for each run of the test-application intent for verifying a plurality of use-cases associated with the test-application intent. In one embodiment, the constraint solver in SystemVerilog would assign constrained values as per the constraint intent for each run of the test-application intent. The memory manager (part of verification component) communicates these values to the software library component using the memory channel in system-under-test as a mailbox. The software library component reads from the memory channel and uses the values during execution of the scenario software implementation. The implementation of such reader functionality on the software library component, along with the implementation of corresponding writer functionality on the memory manager component, is together referred to as "infrastructure component". The infrastructure component is generated by the scenario compiler based on the constraint intent together with the scenario control intent.

During instances where the scenario-control intent decoupled from the test-application intent, as per a computer-implemented verification system 100 methodology, one or more users are alleviated from creation or deletion or management of the underneath infrastructure of memory channels, channel communication details and event synchronization details. The computer-implemented verification system 100 infers all the above details from scenario-control intent and converts into a traditional test bench sequence and OVM and/or UVM compliant test bench sequences. In addition, as per the one or more methodologies implemented through the computer-implemented verification system 100, the test-application intent specified using the defined base class is linked with a constraint-intent. The intention for such linking is to enable users to verify multiple use-cases of the same test-application intent with different interesting values conforming to the constraints, or in other words enable coverage driven verification. The computer-implemented verification system 100 automatically generates infrastructure components within the scenario software implementations to route constraint values from the verification component 108 to respective test-applications executing on the system-under-test. FIG. 2B depicts exemplarily illustrates an input/output flow diagram with an exploded view of the computer-implemented verification system 100 of FIG. 1, according to an embodiment. The scenario software implementations 206 generated by the scenario compiler 108 together with the software library component 110 constitute a test software 208. The verification component 108 interacts with the integrated circuit (or system-under-test) using the generated one or more OVM and/or UVM compliant test bench sequences 204. The software library component 110 enables execution of the scenario software implementations 206 on at least one processing unit core of the integrated circuit.

Figure 2C:
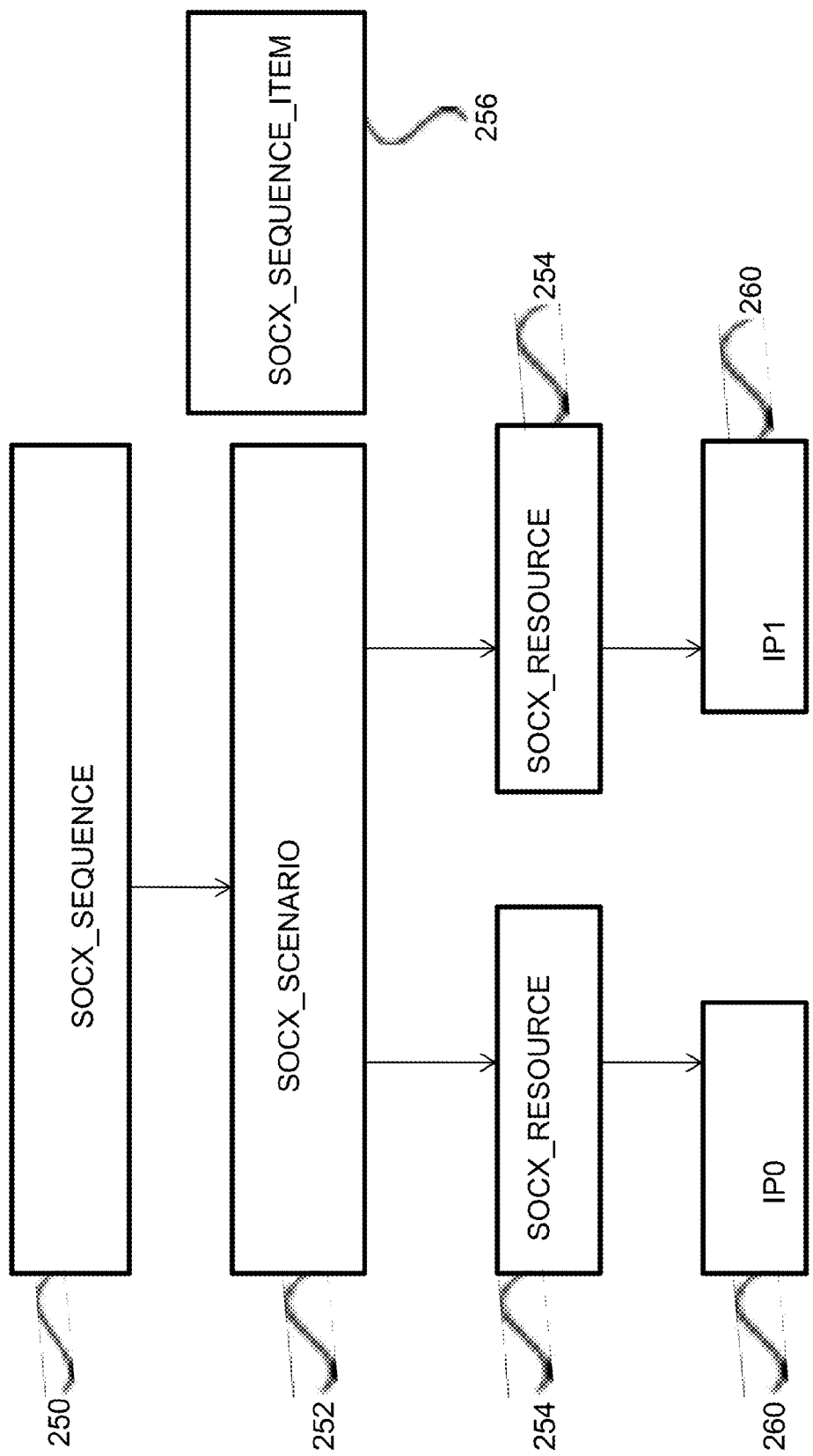
FIG. 2C is a flow diagram illustrating a base class hierarchy as specified in the computer-implemented verification system of FIG. 1, according to an embodiment herein.

FIG. 2C is a flow diagram illustrating a base class hierarchy as specified in the computer-implemented verification system 100 of FIG. 1, according to an embodiment herein. In an embodiment, verification scenario intents comprising at least one of one or more test-application intents, one or more constraints, one or more device-programming intents and one or more scenario-control intents is provided to the computer-implemented verification system 100 using extensions to one or more base classes including, a sequence base class (SOCX_Sequence 250), an a scenario base class (SOCX_Scenario 252), a resource base class (SOCX_Resource 254) and a sequence item base class (SOCX_Sequence-Item 256). The resource base class (SOCX_Resource 254) interacts with and controls a hardware peripheral function, such as IP0 260 or IP1 260. In an embodiment, the resource base class may be intended to a programming intent associated with a resource, the resource representing a leaf level abstraction that captures one or more device programming details. An example of the resource base class is as below:

```
"class eth_mac extends socx_resource;
    import "DPI" function void XTLINX_AXIETH_open( );
    import "DPI" function void XTLINX_AXIETH_close( );
        eth_rx_dma_channel rx_channel;
        chandle rx_desc_ptr;
        function new (input int base_address,
            input int irq_no, string id);
            rx_channel = new(base_address + 32'h1000, "tx_ch");
        endfunction
        task init ( );
            XTLINX_AXIETH_open( );
        endtask
        task finit ( );
            XTLINX_AXIETH_close( );
        endtask
        task device_read(ref socx_mem buffer, input int length);
            rx_channel.submit_desc(rx_desc_ptr, buffer,
                length, 1);
        endtask
        task rx_complete( );
            rx_channel.rx_dma_desc_complete(rx_desc_ptr, 1);
        endtask;
endclass"
```

The scenario base class may be intended to capture the test-application intent and associated with one or more predefined virtual tasks and functions. The scenario extended class may be associated with a constraint intent class. The sequence-item base class represents the constraint intent that is imposed on the test-application intent during execution. An example of the scenario-item base class is as below:

```
"class eth_pkt_item extends socx_sequence_item;
    /* Ethernet packet length */
    rand int pkt_len;
    /* number of packets for transmission */
    rand int pkt_count;
    constraint c_str { pkt_len dist { [100:200] := 50,
                                      [201:300] := 50 }; }
    constraint pkt_count_r { pkt_count dist { [1:2] := 50,
                                               [3:4] := 50 }; }
endclass "
```

The scenario base class is intended to capture test-application intent. The scenario base class has predefined virtual tasks and functions which may need redefinition when extending. For example, for a test application intent as below:

```
"class eth_rx_scn extends socx_scenario #(eth_pkt_item);
    eth_mac                mac;
    char rxbuffer['ETH_RXBUFF_SIZE];
    function new ( );
        mac = new (32'h1000, 2, "mac-id");
    endfunction
    task init( );
        /* raise objection requested from s/w
         * to testbench */
        socx_raise_objection(1);
        mac.init( );
    endtask
    task run( );
        repeat (m_seq_item.pkt_count)
        begin
            mac.device_read(rxbuffer, 'ETH_RXBUFF_SIZE);
            /* request testbench to launch 'eth_send_pkt'
             * on the given sequencer */
            socx_launch_seq("*.active_phy_agent[0].sequencer",
                            "eth_send_pkt", 1,
                            m_seq_item.pkt_len);
            mac.rx_complete( );
        end
    endtask
    task finit( );
        mac.finit( );
        /* drop objection requested from s/w
         * to testbench */
        socx_drop_objection(1);
    endtask
endclass"
```

The extension of scenario class 252 ("eth_rx_scn" of the above test application example) is associated with a constraint intent class "eth_pkt_item". The test-application intent usually refers to one or more objects of SOCX-Resource 254 type, "eth_mac" of the above test application example. The SOCX-Sequence-Item 256 base class represents a constraint intent which needs to be imposed on the test-application intent during execution. The constraint-intent is solved for and fed to the scenario executing on the CPU core of system-under-test. Users can extend the SOCX-Sequence-Item base class to specify their constraints or encapsulate other such derivations of SOCX-Sequence-Item constraint objects. The SOCX-Sequence 250 represents the user's intent of how and when the scenario of interest is to be executed on a CPU core of a system-under-test. The user may extend from the base class SOCX-Sequence 250 to specify their intent of scenario control. In one embodiment, intent may be captured in sub-set of SystemVerilog constructs. An example of the SOCX-Sequence 250 intent is as below:

```
"class eth_tx_seq  extends socx_sequence #(eth_pkt_item);
    eth_rx_scn eth_rx_scn_h;
    eth_pkt_item seq_item_h;
    function new( );
        eth_rx_scn_h = new( );
    endfunction
    task body( );
        repeat (3) begin
            'socx_queue_item(eth_rx_scn_h, seq_item_h);
        end
        eth_rx_scn_h.run_scenario( );
    endtask
endclass"
```

Figure 3:
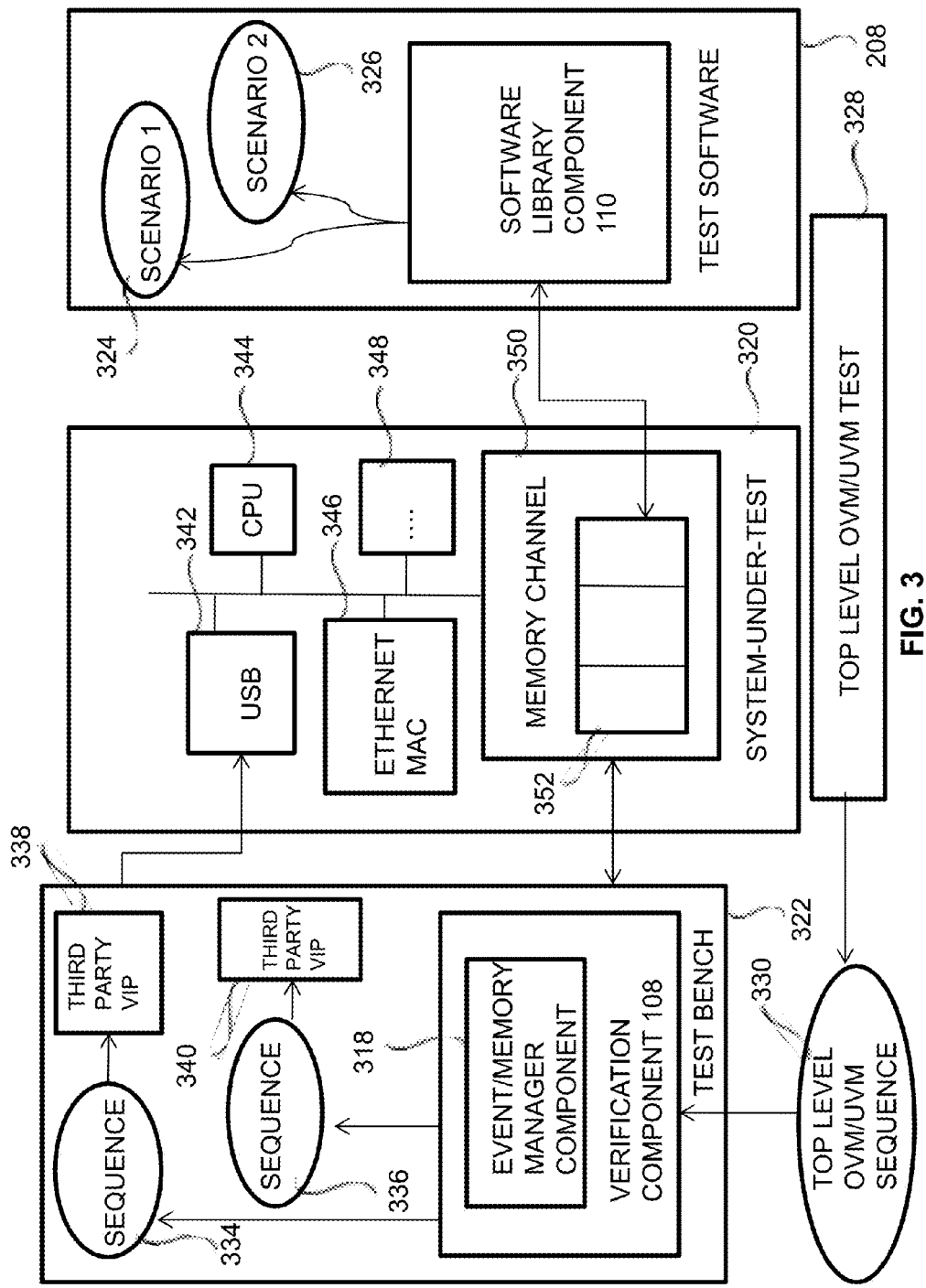
FIG. 3 is a block diagram illustrating a test-setup architecture using components of the computer-implemented verification system 100 according to an embodiment herein.

FIG. 3 is a block diagram illustrating a test-setup architecture using components of the computer-implemented verification system 100 according to an embodiment herein. More particularly, FIG. 3 depicts an exemplary process flow and interactions between the test bench 322, a system under test 320, test software 208 and OVM and/or UVM tests and sequences (328 and 330) based on implementation of the computer-implemented verification system 100 of FIG. 1. The system-under-test 320 has a CPU 344, memory channel 352 in a system memory component 350, and one or more other peripherals such as USB controller 342, Ethernet Media Access Controller (MAC) 346 and other peripherals 348. The verification component 108 is integrated into a test-bench 322. An event/memory manager component 318 may be generated by the computer-implemented verification system 100 based one or more verification scenario intents. The generated event/memory manager component 318 plugs into the verification component 108. The testbench 322 may also have additional components like third party verification IPs (VIP) 338 and 340, and third party sequences (334 and 336) that control such third party VIP. FIG. 3 also depicts a software library component 110 that is automatically linked with the generated scenario software implementation (324 and 326) generate a final test-software executable 208 for executing on a CPU core 344 of the system-under-test 320. The software library component 110 and verification component 108 handle all the coordination and event/memory management details between the test-software 208 and the test-bench 322. The software library component 110 is also in-charge of executing the test-application scenarios 324 and 326 as specified by the scenario-control intent (extension to SOCX-Sequence base class) provided by a user.

During simulation, the generated OVM and/or UVM test 328 launches the top-level generated OVM and/or UVM sequence 330. The generated top-level OVM and/or UVM sequence 330 takes control and depending upon the scenario-control intent and launches the test-application intent on the embedded core of the CPU of the system-under test 320. Prior to launching the test-applications, the generated top-level OVM and/or UVM sequence creates and manages the communication channel in system memory and enqueues different sequence-item objects based on constraint intent for the respective test-application. At the end of each run of test-application, a coverage sample of the constraint intent is automatically sampled by verification component 108. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 4:
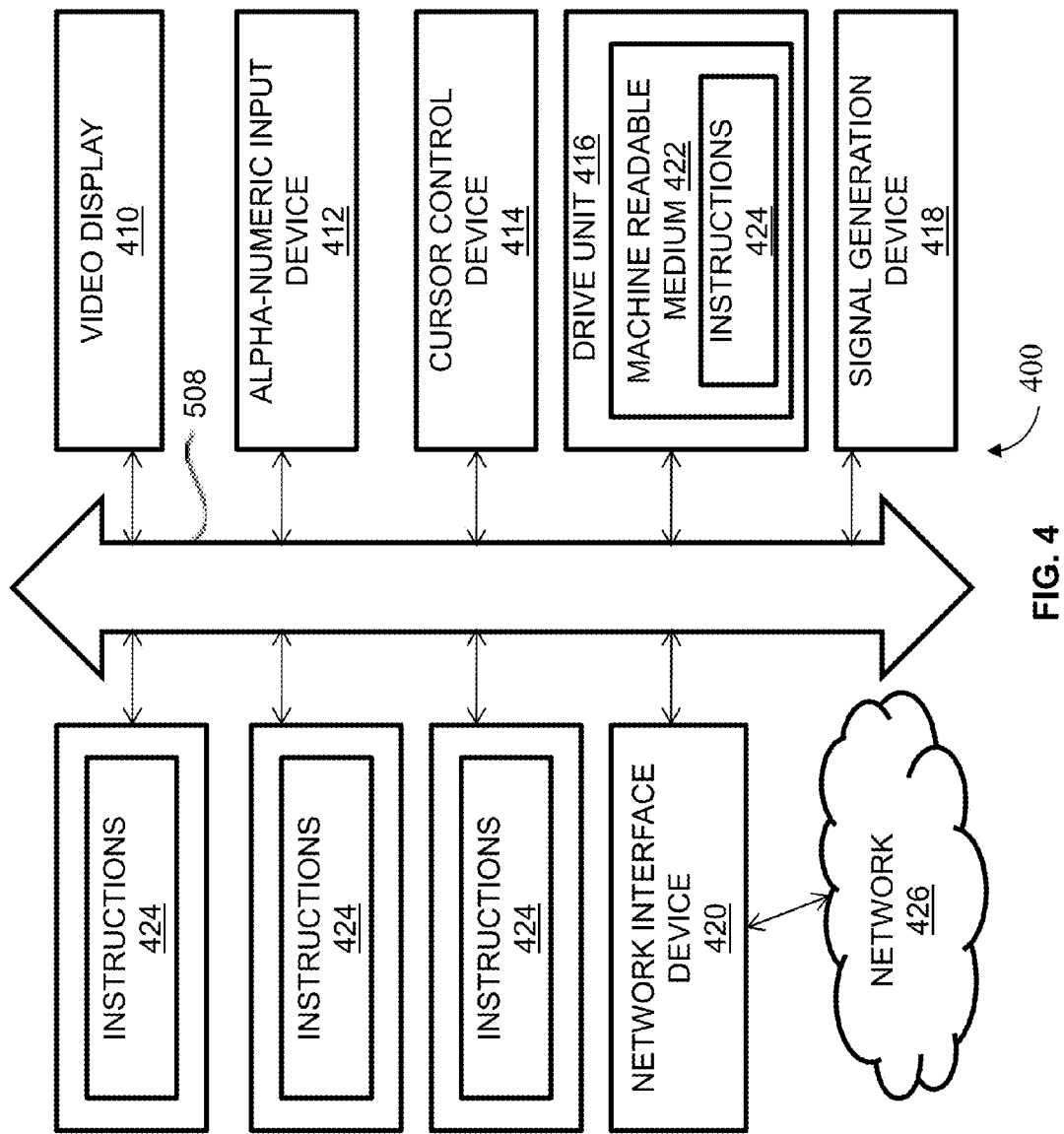
FIG. 4 depicts a functional block diagram of an example general-purpose digital computing environment that may be used to implement various aspects of the present technology disclosed herein.

FIG. 4 depicts a functional block diagram of an example general-purpose digital computing environment 400 that may be used to implement various aspects of the present technology disclosed herein (such as for example, the computer-implemented verification system 100). The general purpose digital computing environment of FIG. 4 includes a processor 402, a main memory 404, a static memory 406, a bus 408, a video display 410, an alpha-numeric input device 412, a cursor control device 414, a drive unit 416, a signal generation device 418, a network interface device 420, a machine readable medium 422, instructions 424, and a network 426, according to one embodiment.

The processor 402 may be include, but is not limited to a microprocessor, a state machine, an application specific integrated circuit, a field programmable gate array, etc. (e.g., an Intel® Pentium® processor). The main memory 404 may be a dynamic random access memory and/or a primary memory of a computer system. The static memory 406 may include for example a hard disk drive for reading from and writing to a hard disk (not shown), a magnetic disk drive for reading from or writing to a removable magnetic disk, or an optical disk drive for reading from or writing to a removable optical disk such as a CD ROM or other optical media. The drives and their associated computer-readable media provide nonvolatile storage of computer readable instructions, data structures, program modules and other data for a computer. It will be appreciated by those skilled in the art that other types of computer readable media that can store data that is accessible by a computer, such as magnetic cassettes, flash memory cards, digital video disks, Bernoulli cartridges, RAMs, ROMs, and the like, may also be used in the example general purpose computing environment 400.

The bus 408 may be an interconnection between various circuits and/or structures of the purpose computing environment 400. The video display 410 may provide a graphical representation of information on the data processing system. The alpha-numeric input device 412 may be a keypad, a keyboard and/or any other input device of text (e.g., a special device to aid the physically handicapped), a microphone, joystick, game pad, satellite dish, scanner or the like. The alpha-numeric input device 412 is often connected to the processing unit through a serial port interface that is coupled to the system bus, but may be connected by other interfaces, such as a parallel port, game port or a universal serial bus (USB).

The cursor control device 414 may be a pointing device such as a mouse. The drive unit 416 may be the hard drive, a storage system, and/or other longer term storage subsystem. The signal generation device 418 may be a bios and/or a functional operating system of the data processing system. The network interface device 420 may be a device that performs interface functions such as code conversion, protocol conversion and/or buffering required for communication to and from the network 426. The machine readable medium 422 may provide instructions on which any of the methods disclosed herein may be performed. The instructions 424 may provide source code and/or data code to the processor 402 to enable any one or more operations disclosed herein.

Various embodiments of the computer-implemented verification system disclosed herein provides (i) a single input specification language to specify system-level verification scenarios, (ii) a structured methodology for test development in verifying system-level interaction and maximizing reuse of such verification intent across verification platforms, (iii) necessary tool based automation in generating relevant test-bench and test-software components to seamless integration into existing verification test platforms and enhancing verification productivity and quality, and (iv) necessary automation and methodology to combine and translate multiple verification intents into multi-threaded test-software and test-bench components with the intention of increasing concurrency in system-under-test.

Also, the embodiments herein enable verifiers to think, explore and experiment with different verification scenarios with the means to achieve taken care by the tool. Further, the tool provides a methodology for a staged verification process at system-level. The methodology to proceed from simple to complex scenarios and reuse of scenarios for top-down development. The methodology also provides maximum reuse of scenarios. The embodiments discussed above (i) provides portability of scenarios by not binding them to test-bench and verification platforms and (ii) a mechanism to increase concurrency in system-under-test through randomization of scenario properties and scenario combination. The computer-implemented verification system 100 intents to improve verification productivity and quality. The computer-implemented verification system 100 achieves this by providing users a) flexibility to specify verification intent in a subset of SystemVerilog constructs, b) automatically generating test-bench and test-software components, and c) providing a methodology for test-development and test-reuse.

The intent acceptance mechanism of the computer-implemented verification system 100 disclosed herein is based on retargeting an existing verification language like SystemVerilog for providing verification intent. SystemVerilog is a hardware description and verification language, adopted as IEEE standard 1800-2012. SystemVerilog offers powerful language abstraction constructs such as object-oriented programming techniques. Retargeting an existing verification language like SystemVerilog for capturing verification scenario intent will lead to easier adoption in the verification engineering community. Also the core methodology of the computer-implemented verification system 100 is enforced on verification intent by providing a set of four extensible base classes, thereby ensuring structured test development and maximum reuse. The computer-implemented verification system 100 permits users to specify the test-application intent and a hardware programming intent in a single unified language using constructs of SystemVerilog. This enables users to work with a single language for intent entry rather than switch between multiple languages. The computer-implemented verification system 100 dedicates one of the base classes for capturing the device and/or the resource programming intent. In the computer-implemented verification system 100, the scenario-control intent (part of the computer-implemented verification system 100 methodology) is specified using SystemVerilog constructs. The computer-implemented verification system 100 converts this intent into OVM and/or UVM "sequence" and "test".

The computer-implemented verification system 100 infers most of the details from the intent and abstracts the management of the infrastructure components. The computer-implemented verification system 100 enables a user to modify one or more internals of management by overriding an implementation of the computer-implemented verification system 100 by redefining the virtual tasks and/or functions provided as part of the computer-implemented verification system 100 methodology. The computer-implemented verification system 100 automatically generates multi-threaded test-application upon multiple test-application intents being combined using the provided methodology. Also, the computer-implemented verification system 100 automatically generates relevant test-bench components like score-boards based on constraint intent and samples coverage for each run of the test-application. The computer-implemented verification system 100 provides a unique mechanism of notifying test-bench about test-software execution to avoid premature exiting of simulation.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A computer-implemented verification system for performing at least one of a system level or a system on chip level functional verification of an integrated circuit, said computer-implemented verification system comprising:
   one or more processors;
   a memory storing instructions defined by one or more modules of said computer-implemented verification system, wherein said one or more processors are configured to execute said instructions, said one or more modules comprising:
      a scenario compiler for:
         receiving a set of verification scenario intents from a user, wherein said set of verification scenario intents comprises at least one of: a) one or more test-application intents, b) one or more constraints, c) one or more device-programming intents and d) one or more scenario-control intents; and
         generating one or more open verification methodology (OVM) and/or universal verification methodology (UVM) compliant test bench sequences and one or more scenario software implementations based on said set of verification scenario intents;
      a verification component configured to interact with said integrated circuit using said generated one or more OVM and/or UVM compliant test bench sequences; and
      a software library component for enabling execution of said scenario software implementations on at least one processing unit core of said integrated circuit,
   wherein said computer-implemented verification system is configured to operate with a verification platform configured to verify said integrated circuit, wherein said verification platform is one of a simulated or an emulated version, said one or more scenario software implementations are executable in said verification platform, wherein said verification platform is configured to operate with said verification component along with said generated OVM and/or UVM compliant test bench sequences, wherein said integrated circuit is compiled to form an emulation image upon said verification platform being emulated, wherein said emulation image executes on said verification platform, and wherein said verification platform is configured to connect a host computer that executes a simulation executable comprising at least one of said generated OVM and/or UVM compliant test bench sequences, said verification component, and a test-bench for said functional verification of said integrated circuit.

2. The computer-implemented verification system of claim 1, wherein said generated software scenario implementations is linked with said software library component to form a software executable, and wherein said software executable is loaded into a system-memory of said integrated circuit.

3. The computer-implemented verification system of claim 2, wherein upon or subsequent to execution of said software executable on said system memory, said software executable is fed with a plurality of values for each run of a test-application intent from among said one or more test application intents for verifying a plurality of use-cases associated with said test-application intent.

4. The computer-implemented verification system of claim 1, wherein said verification component coordinates one or more activities of said one or more scenario software implementations, said software library component and said test bench on said verification platform of said integrated circuit during said functional verification.

5. The computer-implemented verification system of claim 1, wherein said scenario compiler is configured to:
automatically infer from a hierarchical combination of said at least one of said test-application intent and said scenario-control intent that are decoupled from one another; and
generate said one or more OVM or UVM compliant test bench sequences, and said one or more scenario software implementations based on said inferred hierarchical combination.

6. The computer-implemented verification system of claim 1, wherein said scenario compiler is configured to receive said one or more test application intents in an encapsulated form for generating said one or more OVM or UVM compliant test bench sequences, and one or more scenario software implementations based on said encapsulated form of said one or more test application intents.

7. The computer-implemented verification system of claim 1, wherein a from among said one or more test-application intent is linked with said one or more constraint-intents for enabling verification of multiple use-cases of said test-application intent with a plurality of constraint values conforming to said one or more constraint intents.

8. The computer-implemented verification system of claim 7, wherein said scenario compiler is configured to:
automatically generate a plurality of infrastructure components within said scenario software implementations to route said plurality of constraint values from said verification component to one or more scenario software implementations executing on said integrated circuit.

9. The computer-implemented verification system of claim 1, wherein said set of verification scenario intents are described in at least one of a single unified language and a single unified execution environment using a plurality of constructs of System-Verilog, and wherein said plurality of constructs are subsequently processed by said scenario compiler to generate said one or more scenario software implementations and said one or more OVM and/or UVM compliant test bench sequences.

10. A computer-implemented verification system for performing at least one of a system level or a system on chip level functional verification of an integrated circuit, said computer-implemented verification system comprising:
one or more processors;
a memory storing instructions defined by one or more modules of said computer-implemented verification system, wherein said one or more processors are configured to execute said instructions, said one or more modules comprising:
a scenario compiler for:
receiving a set of verification scenario intents from a user, wherein said set of verification scenario intents comprises at least one of: a) one or more test-application intents, b) one or more constraints, c) one or more device-programming intents and d) one or more scenario-control intents; and
generating one or more open verification methodology (OVM) and/or universal verification methodology (UVM) compliant test bench sequences and one or more scenario software implementations based on said set of verification scenario intents, wherein said set of verification scenario intents are received in the form of extensions to a plurality of base classes comprising:
a) a resource base class intended to a programming intent associated with a resource, wherein said resource represents a leaf level abstraction that captures one or more device programming details;
b) a scenario base class intended to capture a test-application intent and associated with one or more predefined virtual tasks and functions;
c) a scenario extended class is associated with a constraint intent class; and
d) a sequence-item base class that represents a constraint intent that is imposed on said test-application intent during execution;
a verification component configured to interact with said integrated circuit using said generated one or more OVM and/or UVM compliant test bench sequences; and
a software library component for enabling execution of said scenario software implementations on at least one processing unit core of said integrated circuit.

11. The computer-implemented verification system of claim 10, wherein said generated OVM and/or UVM compliant test bench sequences along with said verification component, a test-bench and said integrated circuit are compiled to form a simulation executable upon said verification platform being simulated, wherein said simulation executable executes on a host computer for said functional verification of said integrated circuit.

* * * * *